(12) United States Patent
Hung et al.

(10) Patent No.: US 9,748,339 B1
(45) Date of Patent: Aug. 29, 2017

(54) SEMICONDUCTOR DEVICE AND METHOD FOR FABRICATING THE SAME

(71) Applicant: Vanguard International Semiconductor Corporation, Hsinchu (TW)

(72) Inventors: Pei-Heng Hung, New Taipei (TW);
Manoj Kumar, Dhanbad (IN);
Chia-Hao Lee, New Taipei (TW);
Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/399,999

(22) Filed: Jan. 6, 2017

(51) Int. Cl.
| | |
|---|---|
| *H01L 27/02* | (2006.01) |
| *H01L 29/10* | (2006.01) |
| *H01L 29/06* | (2006.01) |
| *H01L 29/78* | (2006.01) |
| *H01L 29/739* | (2006.01) |
| *H01L 29/66* | (2006.01) |
| *H01L 21/265* | (2006.01) |

(Continued)

(52) U.S. Cl.
CPC .... *H01L 29/1095* (2013.01); *H01L 21/26586* (2013.01); *H01L 21/324* (2013.01); *H01L 29/0649* (2013.01); *H01L 29/0834* (2013.01); *H01L 29/0865* (2013.01); *H01L 29/0882* (2013.01); *H01L 29/66325* (2013.01); *H01L 29/66681* (2013.01); *H01L 29/7393* (2013.01); *H01L 29/7816* (2013.01)

(58) Field of Classification Search
CPC .................................................. H01L 29/66681
See application file for complete search history.

(56) References Cited

U.S. PATENT DOCUMENTS

| | | | | |
|---|---|---|---|---|
| 2009/0230426 | A1* | 9/2009 | Carpenter, Jr. | ..... H01L 27/0255 257/173 |
| 2010/0163973 | A1* | 7/2010 | Nakamura | .......... H01L 27/0635 257/328 |

(Continued)

FOREIGN PATENT DOCUMENTS

| | | |
|---|---|---|
| TW | 201234564 A1 | 8/2012 |
| TW | 201351612 A | 12/2013 |

(Continued)

*Primary Examiner* — Thao P Le
(74) *Attorney, Agent, or Firm* — Birch, Stewart, Kolasch & Birch, LLP

(57) ABSTRACT

A semiconductor device includes a semiconductor substrate and a semiconductor layer formed thereon; a first well region disposed in a portion of the semiconductor layer; a second well region disposed in another portion of the semiconductor layer; a pair of third well regions disposed in a portion of the semiconductor layer at opposite sides of the second well region; a plurality of isolation elements disposed over the semiconductor layer, respectively between the third well regions and the first and second well region; a deep well region disposed in a portion of the semiconductor substrate adjacent to the semiconductor layer between the first and second well region; a first doping region disposed in the first well region; and second doping regions disposed in the third well regions.

20 Claims, 10 Drawing Sheets

(51) Int. Cl.
*H01L 21/324* (2006.01)
*H01L 29/08* (2006.01)

(56) References Cited

U.S. PATENT DOCUMENTS

| | | | | |
|---|---|---|---|---|
| 2013/0032882 A1* | 2/2013 | Salcedo | ............. | H01L 27/0262 |
| | | | | 257/355 |
| 2014/0138735 A1* | 5/2014 | Clarke | ................ | H01L 29/0692 |
| | | | | 257/124 |
| 2014/0167105 A1* | 6/2014 | Salcedo | ............. | H01L 27/0262 |
| | | | | 257/140 |
| 2014/0167106 A1 | 6/2014 | Salcedo | | |

FOREIGN PATENT DOCUMENTS

| | | | |
|---|---|---|---|
| TW | 201431094 A | 8/2014 | |
| TW | 201448234 A | 12/2014 | |
| TW | 201601291 A | 1/2016 | |

* cited by examiner

SEMICONDUCTOR DEVICE AND METHOD FOR FABRICATING THE SAME

CROSS REFERENCE TO RELATED APPLICATIONS

BACKGROUND

The present disclosure relates to an integrated circuit device, and in particular it relates to a semiconductor device and a formation method thereof.

Power devices should be high-switching and able to withstand high voltage (e.g., several hundred volts).

Various power devices have been developed, for example, an HV metal-oxide-semiconductor (HVMOS transistor), an insulated gate bipolar transistor (IGBT), a junction field effect transistor (JFET), and a Schottky diode.

The existing high-switching power devices mentioned above are generally used, for example, in power systems of appliances, communication devices, and generators for vehicles for power amplification, power control, and other applications.

SUMMARY

According to an embodiment, the present disclosure relates to a semiconductor device including a semiconductor substrate, a semiconductor layer, a first well region, a second well region, a pair of third well regions, a plurality of isolation elements, a deep well region, a first doping region, and second doping regions. The semiconductor substrate has a first conductive type. The semiconductor layer is disposed on the semiconductor substrate. The semiconductor layer has the first conductive type. The first well region is disposed in a portion of the semiconductor layer. The first well region has a second conductive type, which is opposite to the first conductive type. The second well region is disposed in another portion of the semiconductor layer. The second well region has the second conductive type. The third well regions are disposed in a portion of the semiconductor layer at opposite sides of the second well region. The third well regions have the first conductive type. The first well region and one of the third well regions are separated by the semiconductor layer. The isolation elements are disposed on the semiconductor layer. The isolation elements are respectively disposed between the third well regions and the first and second well region. The deep well region is disposed in a portion of the semiconductor substrate adjacent to the semiconductor layer, between the first and second well region. The deep well region has the second conductive type. The first doping region is disposed in the first well region. The first doping region has the second conductive type. The second doping regions are disposed in the third well regions. The second doping regions have the first conductive type.

According to another embodiment, the semiconductor device of the present disclosure further includes a third doping region disposed in the second well region.

According to an embodiment, the present disclosure relates to a method for fabricating a semiconductor device. The method includes providing a semiconductor substrate having a first conductive type; forming a plurality of separate doping regions having a second conductive type opposite to the first conductive type in the semiconductor substrate; forming a semiconductor layer having the first conductive type on the semiconductor substrate; forming a first well region and a second well region in a portion of the semiconductor layer, wherein the first well region and the second well region are separate and have the second conductive type; forming a pair of third well regions in a portion of the semiconductor layer at opposite sides of the second well region, wherein the pair of third well regions have the first conductive type, and wherein the first well region and one of the third well regions are separated by the semiconductor layer; performing a thermal annealing process to diffuse and connect the plurality of doping regions to form a deep well region having the second conductive type, wherein the deep well region is adjacent to the semiconductor layer between the first and second well region; forming a plurality of isolation elements on the semiconductor layer, wherein the plurality of isolation elements are respectively between the third well regions and the first and second well region; forming a first doping region having the second conductive type in the first well region; and forming second doping regions having the first conductive type in the third well regions.

According to another embodiment, the step of forming the first doping region in the first well region of the method for fabricating a semiconductor device in the present disclosure further includes forming a third doping region in the second well region.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
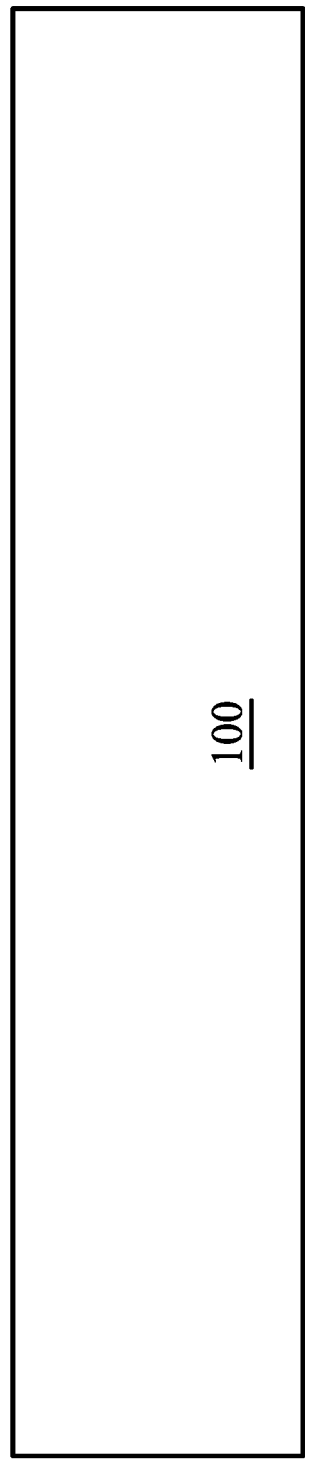
FIG. 1 is one of a series of cross-sectional views (FIG. 1-8) which illustrate a process for fabricating a semiconductor device according to an embodiment of the present disclosure.

Many different embodiments with the accompanying figures are provided to describe various aspects of the present disclosure. Same reference numerals and/or letters might be used in the specification or figures for the same or similar elements. In addition, in the figures, the shape or thickness of the various features may be arbitrarily increased for the interests of simplicity or clarity. Furthermore, portions of the devices in the figures can be respectively described. It should be noted that some features well-known by those skilled in the art are not illustrated in the figures. Specific examples of components and arrangements are described below to simplify the present disclosure. These are, of course, merely examples and are not intended to be limiting.

Please refer to FIG. 1-8, which are a series of cross-sectional views and illustrate a process for fabricating a semiconductor device according to an embodiment of the present disclosure.

As shown in FIG. 1, at first, a semiconductor substrate 100 (e.g., a silicon substrate) is provided. In an embodiment, the semiconductor substrate 100 has a first conductive type (e.g., p-type), and a resistivity of 30 ohm-cm to 60 ohm-cm.

Figure 2:
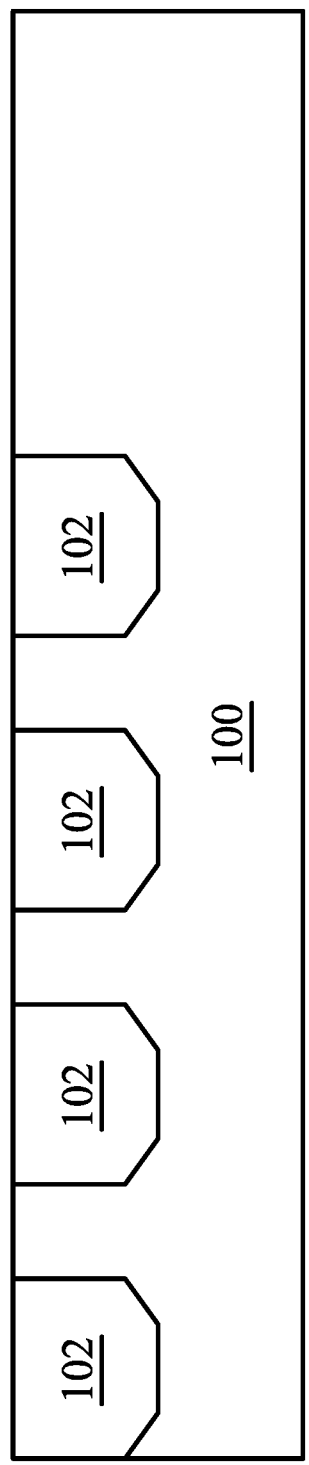
FIG. 2 is one of a series of cross-sectional views (FIG. 1-8) which illustrate a process for fabricating a semiconductor device according to an embodiment of the present disclosure.

As shown in FIG. 2, a plurality of separate doping regions 102 are formed in the semiconductor substrate 100 by using patterned masks (not illustrated) and performing an ion implantation process (not illustrated). Herein, the doping regions 102 are formed separately in a portion of the semiconductor substrate 100. Each of the doping regions 102 has a second conductive type (e.g., n-type), and has a dopant concentration of about $1.0E12$ atoms/cm$^2$ to $5.0E13$ atoms/cm$^2$. The ion implantation process used to form the doping regions 102 can be performed with the ion beam incident perpendicular to the surface of the semiconductor substrate 100.

Figure 3:
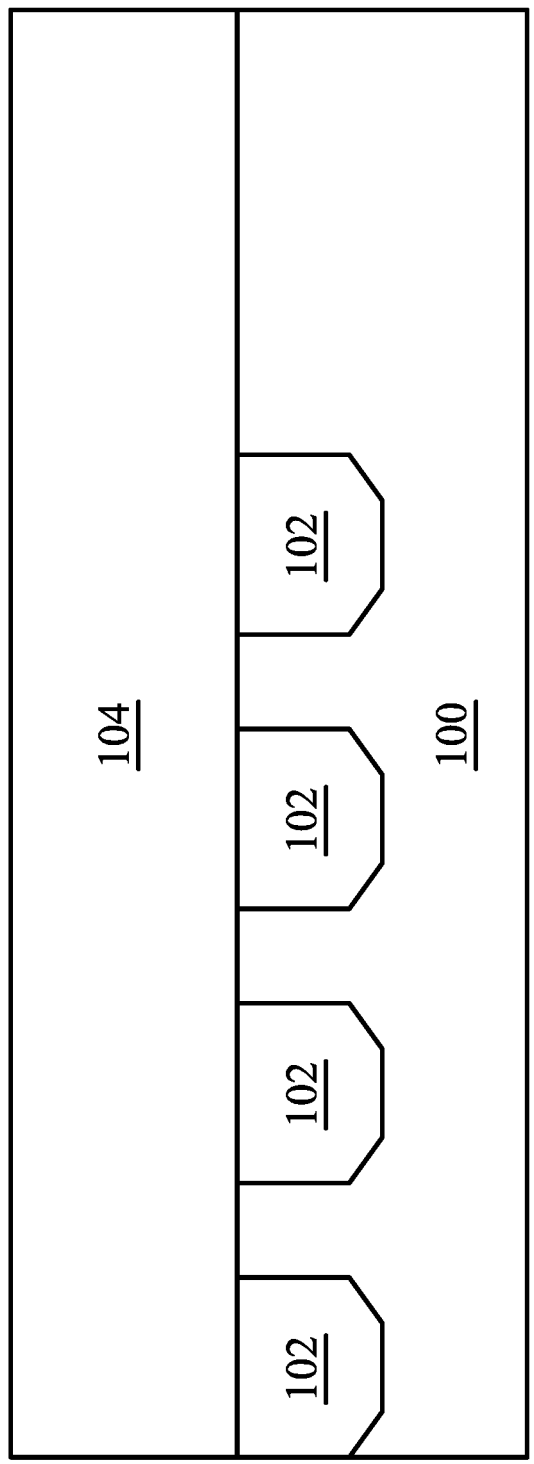
FIG. 3 is one of a series of cross-sectional views (FIG. 1-8) which illustrate a process for fabricating a semiconductor device according to an embodiment of the present disclosure.

As shown in FIG. 3, a semiconductor layer 104 is formed on the semiconductor substrate 100 (as shown in FIG. 2). The semiconductor layer 104 can be formed using an epitaxy method. The semiconductor layer 104 can include semiconductor materials, such as silicon. The semiconductor layer 104 has the first conductive type (e.g., p-type), and a resistivity of 30 ohm-cm to 60 ohm-cm. In an embodiment, the semiconductor layer 104 has a thickness of 0.5 um to 10 um (micron).

Figure 4:
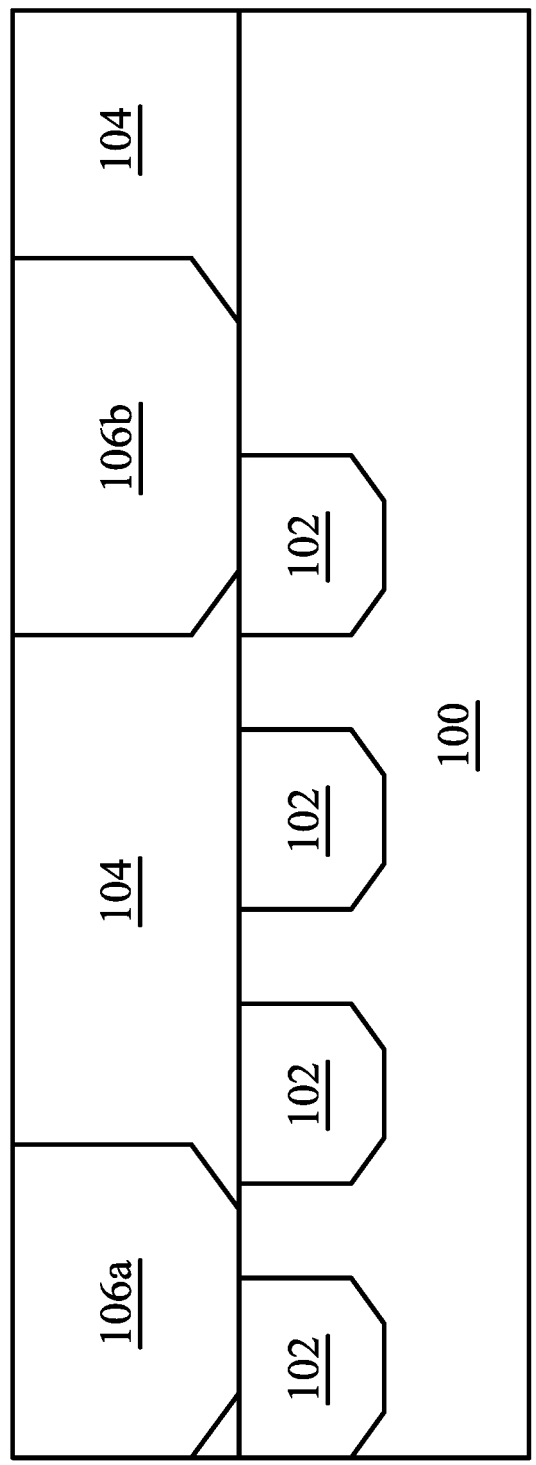
FIG. 4 is one of a series of cross-sectional views (FIG. 1-8) which illustrate a process for fabricating a semiconductor device according to an embodiment of the present disclosure.

As shown in FIG. 4, a first well region 106a and a second well region 106b, which are separate, are formed in a portion of the semiconductor layer 104 by using patterned masks (not illustrated) and performing an ion implantation process (not illustrated). The first well region 106a and the second well region 106b have the second conductive type (e.g., n-type), and have a dopant concentration of about $1.0E12$ atoms/cm$^2$ to $1.0E13$ atoms/cm$^2$. The ion implantation process used to form the first well region 106a and the second well region 106b can be performed with the ion beam incident perpendicular to the surface of the semiconductor layer 104.

As shown in FIG. 4, the first well region 106a is substantially disposed on the leftmost doping region 102. The second well region 106b is substantially disposed on the rightmost doping region 102.

Figure 5:
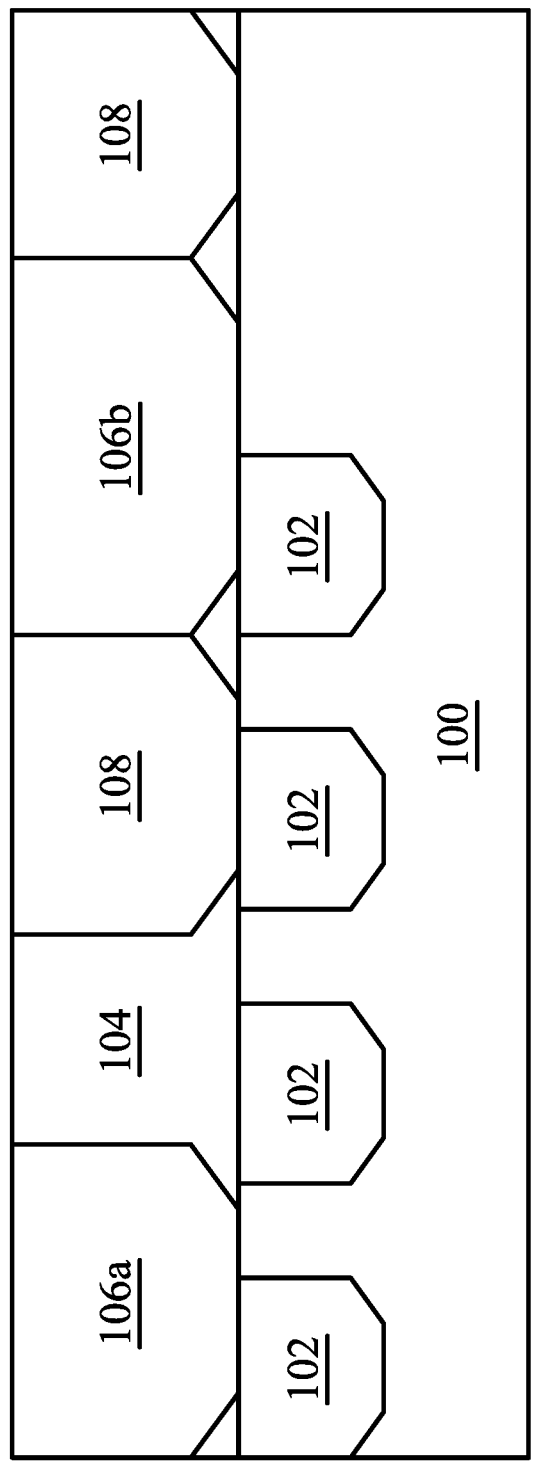
FIG. 5 is one of a series of cross-sectional views (FIG. 1-8) which illustrate a process for fabricating a semiconductor device according to an embodiment of the present disclosure.

As shown in FIG. 5, a pair of third well regions, which are separate, are formed in a portion of the semiconductor layer 104 adjacent to opposite sides of the second well region 106b by using patterned masks (not illustrated) and performing an ion implantation process (not illustrated). Herein, the third well regions have the first conductive type (e.g., p-type), and have a dopant concentration of about $1.0E12$ atoms/cm$^2$ to $1.0E13$ atoms/cm$^2$. The first well region 106a and the third well region 108 which is on the left side of the second well region 106b are separated by the semiconductor layer 104. The ion implantation process used to form the third well regions 108 can be performed with the ion beam incident perpendicular to the surface of the semiconductor layer 104.

Figure 6:
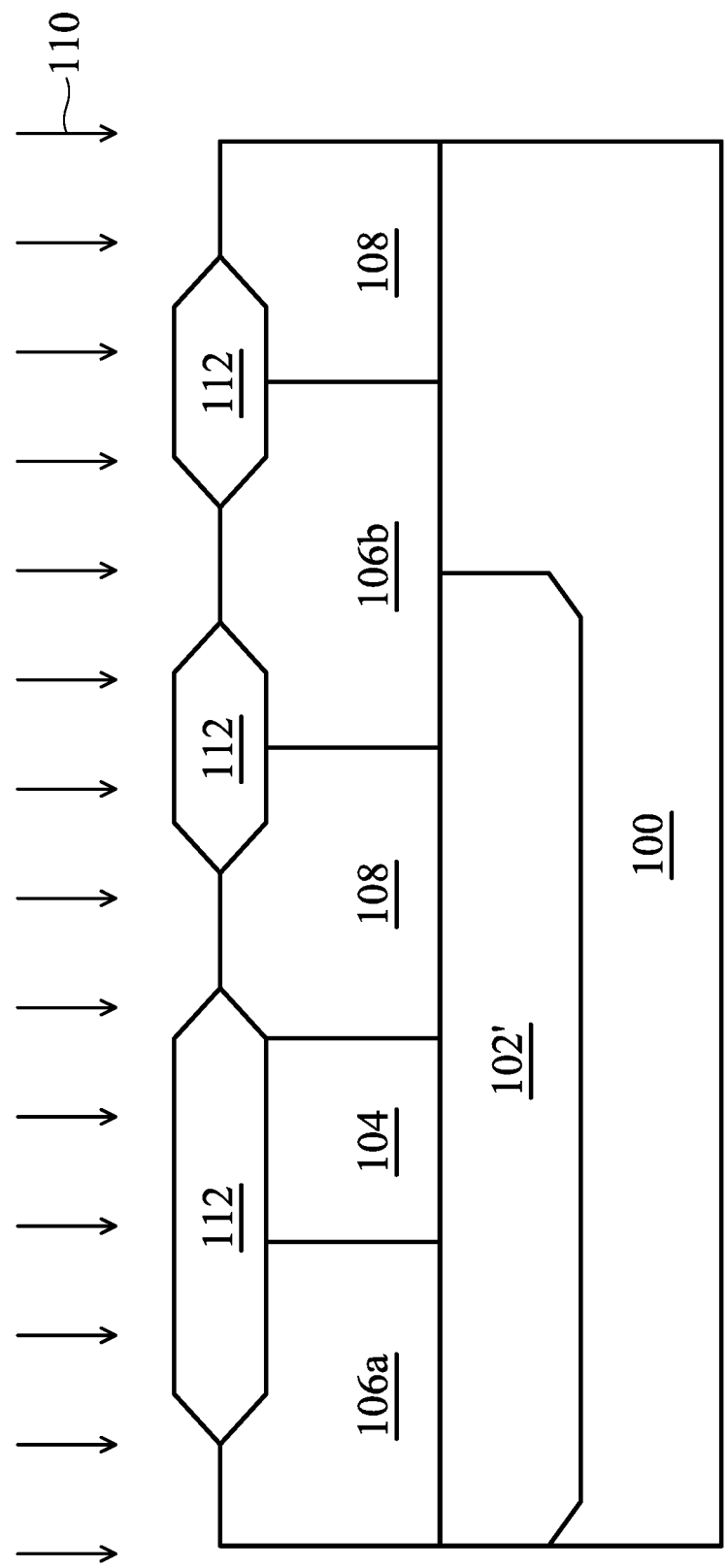
FIG. 6 is one of a series of cross-sectional views (FIG. 1-8) which illustrate a process for fabricating a semiconductor device according to an embodiment of the present disclosure.

As shown in FIG. 6, then, a thermal diffusion process 110 (e.g., a thermal annealing process) is performed on the structure as illustrated in FIG. 5 to diffuse the dopants in the separate doping regions 102 to form a continuous deep well region 102'. Herein, the thermal diffusion process 110 also diffuses the dopants in the first well region 106a, the second well region 106b, and the third well regions 108. FIG. 6 illustrates the deep well region 102', the first well region 106a, the second well region 106b, and the third well regions 108 after performing the thermal diffusion process 110. The deep well region 102' is disposed in a portion of the semiconductor substrate 100 under and between the first well region 106a and the second well region 106b. The deep well region 102' is under a portion of the semiconductor layer 104 and under the third well region which is between the first well region 106a and the second well region 106b. In an embodiment, the deep well region 102' has the second conductive type (e.g., n-type).

Still referring to FIG. 6, a plurality of isolation elements 112 are then formed on the semiconductor layer 104. As shown in FIG. 6, the isolation elements 112 are disposed between the third well regions 108 and the first well region 106a and between the third well regions 108 and the second well region 106b. The isolation elements 112 illustrated herein are field oxides (FOX). However, in other embodiments, the isolation elements 112 can be shallow trench isolations (STI). The isolation elements 112 can include insulation materials (e.g., $SiO_2$), and can be formed using conventional methods for fabricating field oxides or shallow trench isolations.

Figure 7:
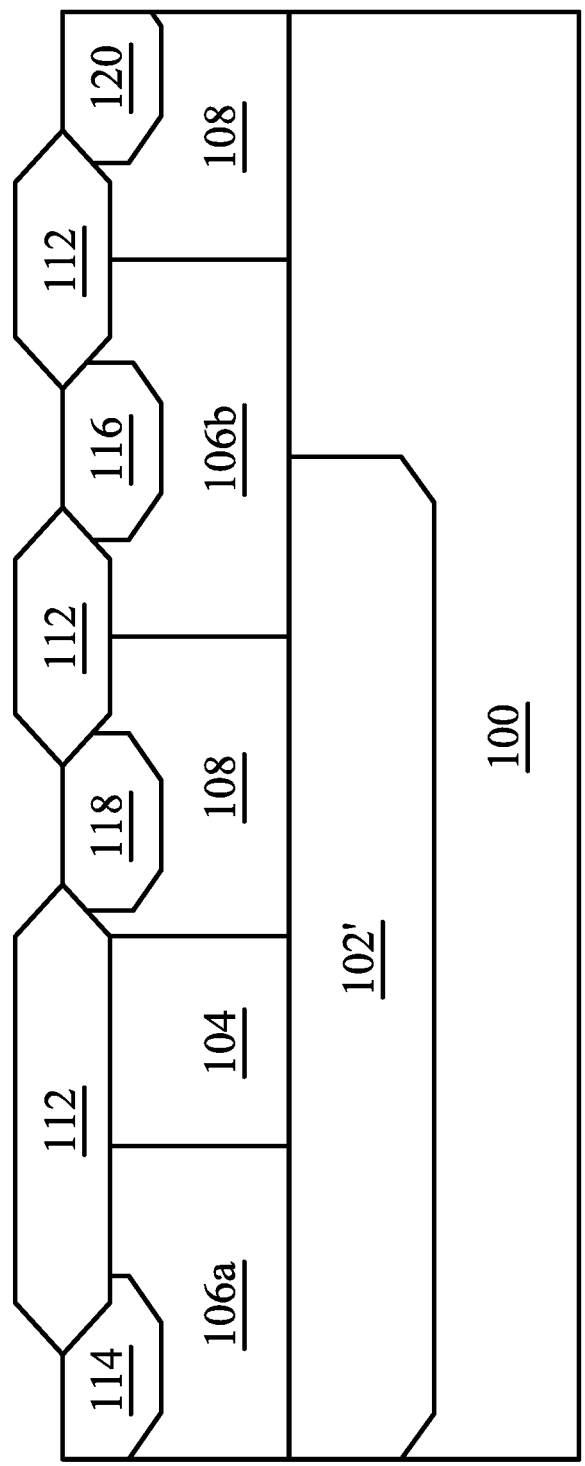
FIG. 7 is one of a series of cross-sectional views (FIG. 1-8) which illustrate a process for fabricating a semiconductor device according to an embodiment of the present disclosure.

As shown in FIG. 7, a first doping region 114 is formed in the first well region 106a, and a second doping region 116 is formed in the second well region 106b, by using patterned masks (not illustrated) and performing an ion implantation process (not illustrated). The first doping region 114 and the second doping region 116 have the second conductive type (e.g., n-type), and have a dopant concentration of about $5.0E14$ atoms/cm$^2$ to $7.0E15$ atoms/cm$^2$. The ion implantation process used to form the first doping region 114 and the second doping region 116 can be performed with the ion beam incident perpendicular to the surface of the semiconductor layer 104.

Still referring to FIG. 7, third doping regions 118 and 120 are formed in the third well regions 108 by using other patterned masks (not illustrated) and performing another ion implantation process (not illustrated). The third doping regions 118 and 120 have the first conductive type (e.g., p-type), and have a dopant concentration of about $5.0E14$ atoms/cm$^2$ to $7.0E15$ atoms/cm$^2$. The ion implantation process used to form the third doping regions 118 and 120 can be performed with the ion beam incident perpendicular to the surface of the semiconductor layer 104.

Figure 8:
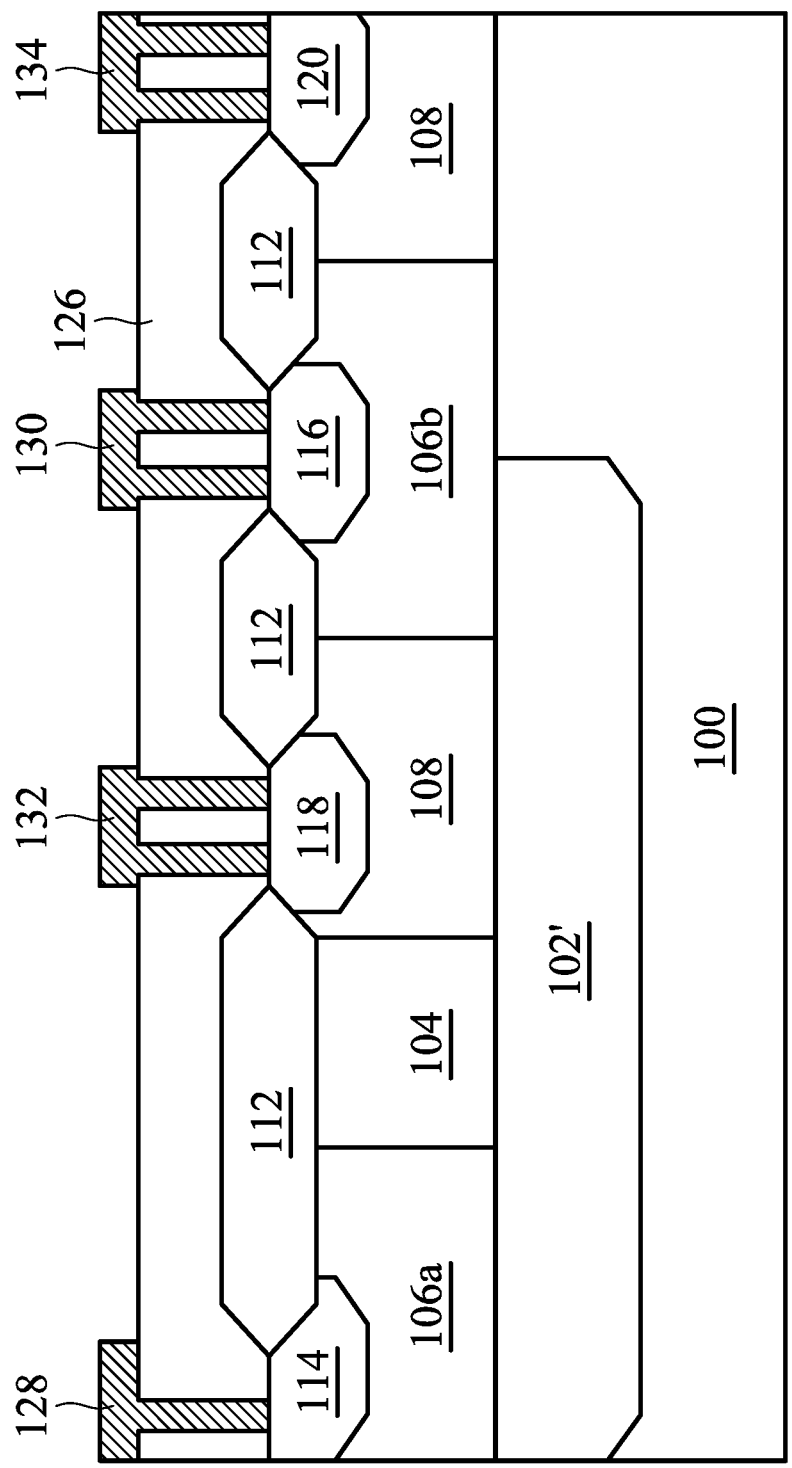
FIG. 8 is one of a series of cross-sectional views (FIG. 1-8) which illustrate a process for fabricating a semiconductor device according to an embodiment of the present disclosure.

As shown in FIG. 8, a dielectric layer 126 is then formed on the semiconductor layer 104 to cover the first well region 106a, second well region 106b, third well regions 108, and isolation elements 112. In an embodiment, the dielectric layer 126 includes dielectric materials (e.g. $SiO_2$), and has a thickness of about 0.5 um to 2.5 um (micron).

Then, several openings are formed in the dielectric layer 126. The openings respectively expose a portion of the first doping region 114, the second doping region 116, and the third doping regions 118 and 120. Then, a blanket layer of conductive material is deposited (not illustrated) on the dielectric layer 126 and fill in the openings. Then, a patterning process is performed (not illustrated) to remove a portion of the conductive material to form a first conductive contact 128, a second conductive contact 130, and third conductive contacts 132 and 134. The first conductive contact 128 is on the semiconductor layer 104 and in physical contact with the first doping region 114. The second conductive contact 130 is on the semiconductor layer 104 and in physical contact with the second doping region 116. The third conductive contacts 132 and 134 are respectively on different portions of the semiconductor layer 104. The third conductive contacts 132 and 134 are respectively in physical contact with one of the third doping regions 118 and 120.

As shown in FIG. 1-8, the formation of a semiconductor device according to an embodiment of the present disclosure is illustrated. FIG. 8 illustrates a semiconductor device according to an embodiment of the present disclosure. The semiconductor device illustrated in FIG. 8 is applicable to power device which is high-switching and should be able to withstand high voltages (e.g., several hundreds of volts or greater than 200 volts).

In an embodiment, the third doping regions 118 and 120 are used as gates. The third conductive contacts 132 and 134 connected to the third doping regions 118 and 120 are used as gate electrodes. In addition, the first doping region 114 is used as a drain, and the first conductive contact 128 connected to the first doping region 114 is used as a drain electrode. Furthermore, the second doping region 116 is used as a source, and the second conductive contact 130 connected to the second doping region 116 is used as a source electrode. Therefore, during the operation, the elements of the semiconductor device illustrated in FIG. 8 forms a lateral junction field effect transistor (lateral JFET) which can be operated with the above-mentioned gates, source, drain, and other related elements.

In an embodiment, by using the deep well region 102' and other related doping regions, the semiconductor device illustrated in FIG. 8 has high blocking voltage and low pinch-off voltage during the operation. In addition, the semiconductor device illustrated in FIG. 8 has the advantages of simple fabrication, and doesn't need additional processes.

Figure 9:
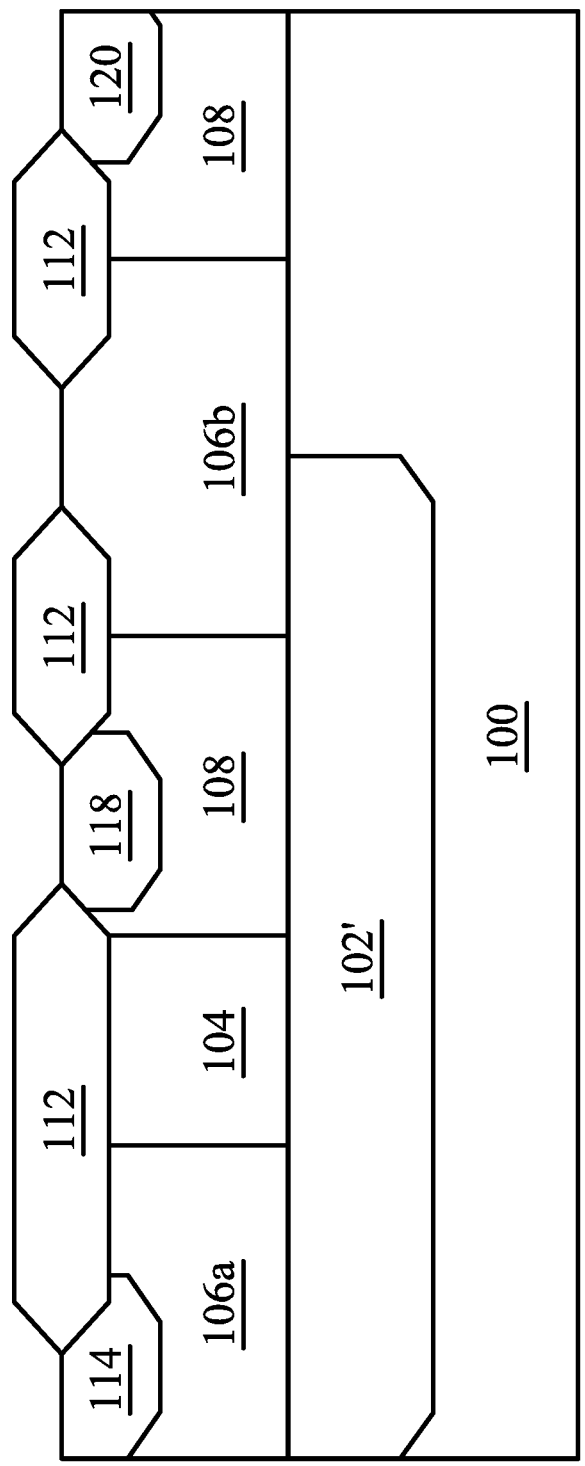
FIG. 9 is one of a series of cross-sectional views (FIG. 9-10) which illustrate a process for fabricating a semiconductor device according to another embodiment of the present disclosure.
Figure 10:
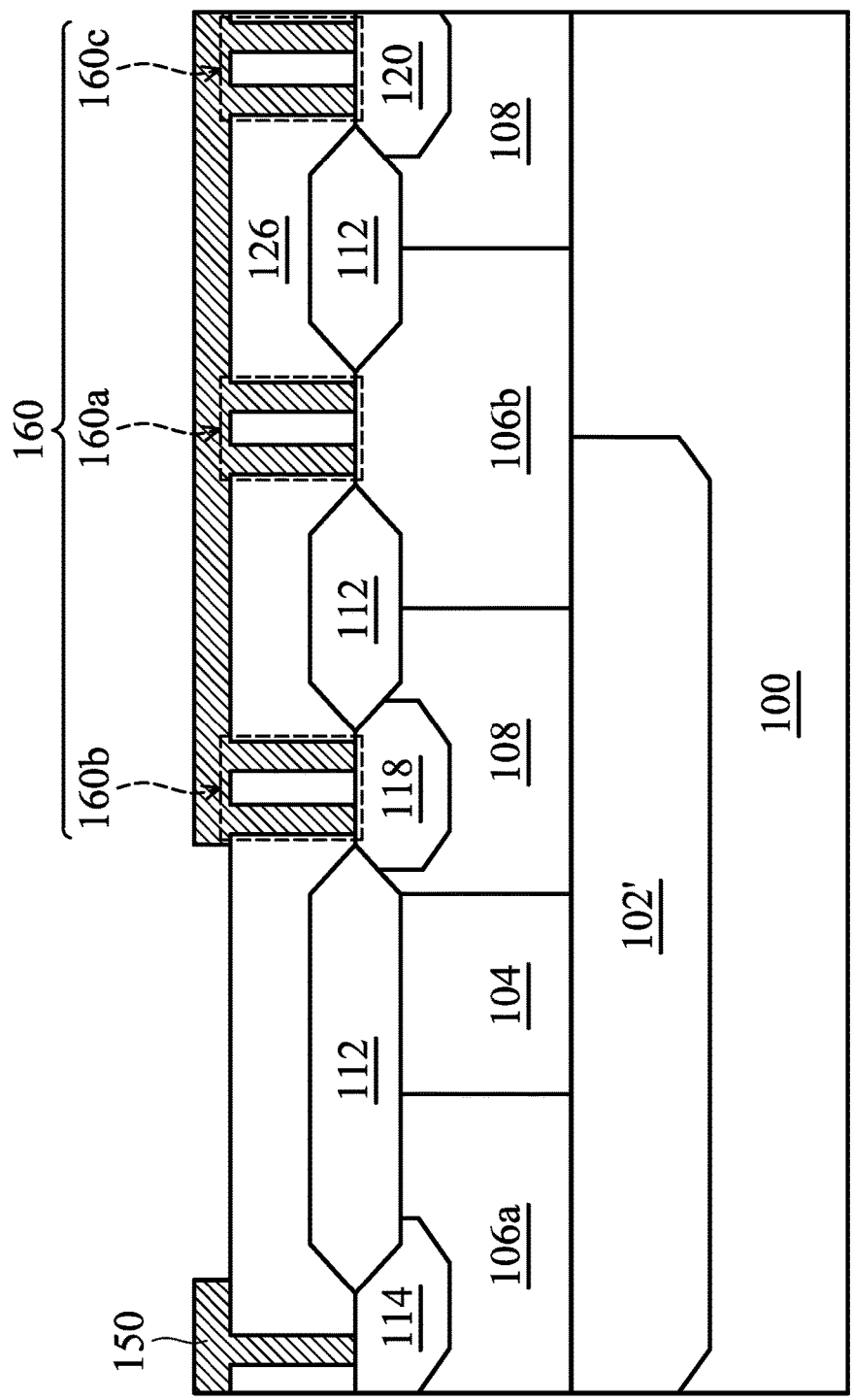
FIG. 10 is one of a series of cross-sectional views (FIG. 9-10) which illustrate a process for fabricating a semiconductor device according to another embodiment of the present disclosure.

FIG. 9-10 are a series of cross-sectional views which illustrate a process for fabricating a semiconductor device according to another embodiment of the present disclosure. The method for fabricating the semiconductor device shown in FIG. 9-10 modifies the method for fabricating the semiconductor device shown in FIG. 1-8. Herein, same reference numerals represent same elements as illustrated in FIG. 1-8, and only the difference between FIG. 1-8 and FIG. 9-10 will be described in the following.

As shown in FIG. 9, at first, the processes illustrated in FIG. 1-6 are performed to obtain the structure illustrated in FIG. 6. Then, a first doping region 114 is formed in the first well region 106a by using patterned masks (not illustrated) and performing an ion implantation process (not illustrated). However, no second doping region 116 (as shown in FIG. 7) is formed in the second well region 106b. Therefore, no doping region is formed in the second well region 106b. In an embodiment, the first doping region 114 has the second conductive type (e.g., n-type), and has a dopant concentration of about $5.0E14$ atoms/$cm^2$ to $7.0E15$ atoms/$cm^2$. The ion implantation process used to form the first doping region 114 can be performed with the ion beam incident perpendicular to the surface of the semiconductor layer 104.

Still referring to FIG. 9, third doping regions 118 and 120 are formed in the third well regions 108 by using other patterned masks (not illustrated) and performing another ion implantation process (not illustrated). The third doping regions 118 and 120 have the first conductive type (e.g., p-type), and have a dopant concentration of about $5.0E14$ atoms/$cm^2$ to $7.0E15$ atoms/$cm^2$. The ion implantation process used to form the third doping regions 118 and 120 can be performed with the ion beam incident perpendicular to the surface of the semiconductor layer 104.

As shown in FIG. 10, a dielectric layer 126 is formed on the semiconductor layer 104 to cover the first well region 106a, second well region 106b, third well regions 108, and isolation elements 112. In an embodiment, the dielectric layer 126 includes dielectric materials (e.g. $SiO_2$), and has a thickness of about 0.5 um to 2.5 um (micron).

Then, several openings are formed in the dielectric layer 126. The openings respectively expose a portion of the first doping region 114, the second well region 106b, and the third doping regions 118 and 120. Then, a blanket layer of conductive material is deposited (not illustrated) on the dielectric layer 126 and fill in the openings. Then, a patterning process is performed (not illustrated) to remove a portion of the conductive material to form a first conductive contact 150, a second conductive contact 160. The first conductive contact 150 is on the semiconductor layer 104 and in physical contact with the first doping region 114. The second conductive contact 160 is simultaneously in physical contact with the third doping regions 118 and 120, and the second well region 106b. The second conductive contact 160 includes a first portion 160a on the semiconductor layer 104 and in physical contact with the second well region 106b, a second portion 160b, and a third portion 160c. The second portion 160b and third portion 160c are on different portions of the semiconductor layer 104, and are respectively in physical contact with one of the third doping regions 118 and 120.

As shown in FIG. 9-10, the formation of a semiconductor device according to another embodiment of the present disclosure is illustrated. FIG. 10 illustrates a semiconductor device according to another embodiment of the present disclosure. The semiconductor device illustrated in FIG. 10 is applicable to power device which is high-switching and should be able to withstand high voltages (e.g., several hundreds of volts or greater than 200 volts).

In an embodiment, the third doping regions 118 and 120 and the second well region 106b are used as anode side. The second conductive contact 160 simultaneously connected to the third doping regions 118 and 120 and the second well region 106b is used as an anode electrode. In addition, the first doping region 114 is used as a cathode side, and the first conductive contact 150 connected to the first doping region 114 is used as a cathode electrode. Therefore, during the operation, the elements of the semiconductor device illustrated in FIG. 10 forms a Schottky diode which can be operated with the above-mentioned anode, cathode, and other related elements.

In an embodiment, by using the deep well region 102' and other related doping regions, the semiconductor device illustrated in FIG. 10 has high blocking voltage and low reverse current during the operation. In addition, the semiconductor device illustrated in FIG. 10 has the advantages of simple fabrication, and doesn't need additional processes.

Although the disclosure has been described by way of example and in terms of the preferred embodiments, they are not used to limit the present disclosure. Those skilled in the art may design or modify other processes and structures without departing from the spirit and scope of the present disclosure. Therefore, the scope of protection is better determined by the claims.

What is claimed is:

1. A semiconductor device, comprising:
a semiconductor substrate having a first conductive type;
a semiconductor layer disposed on the semiconductor substrate, wherein the semiconductor layer has the first conductive type;
a first well region disposed in a portion of the semiconductor layer, wherein the first well region has a second conductive type opposite to the first conductive type;
a second well region disposed in another portion of the semiconductor layer, wherein the second well region has the second conductive type;
a pair of third well regions disposed in a portion of the semiconductor layer at opposite sides of the second well region, wherein the pair of third well regions have the first conductive type, and wherein the first well region and one of the third well regions are separated by the semiconductor layer;
a plurality of isolation elements disposed on the semiconductor layer, wherein the plurality of isolation elements are respectively between the third well regions and the first and second well region;
a deep well region disposed in a portion of the semiconductor substrate adjacent to the semiconductor layer between the first and second well region, wherein the deep well region has the second conductive type;
a first doping region disposed in the first well region, wherein the first doping region has the second conductive type; and
second doping regions disposed in the third well regions, wherein the second doping regions have the first conductive type.

2. The semiconductor device of claim 1, further comprising:
a first conductive contact disposed on the semiconductor layer, wherein the first conductive contact is in physical contact with the first doping region;
a second conductive contact disposed on the semiconductor layer, wherein the second conductive contact is in physical contact with both the second doping regions in the third well regions and the second well region.

3. The semiconductor device of claim 1, wherein the first conductive contact is a cathode electrode, and the second conductive contact is an anode electrode.

4. The semiconductor device of claim 1, wherein the deep well region has a greater dopant concentration than the first well region and the second well region.

5. The semiconductor device of claim 1, wherein the first doping region has a greater dopant concentration than the first well region.

6. The semiconductor device of claim 1, wherein the second doping regions have a greater dopant concentration than the third well regions.

7. The semiconductor device of claim 1, further comprising a third doping region disposed in the second well region.

8. The semiconductor device of claim 7, further comprising:
a first conductive contact disposed on the semiconductor layer, wherein the first conductive contact is in physical contact with the first doping region;
a second conductive contact disposed on the semiconductor layer, wherein the second conductive contact is in physical contact with the third doping region; and
a third conductive contact disposed on the semiconductor layer, wherein the third conductive contact is in physical contact with the second doping regions in the third well regions.

9. The semiconductor device of claim 7, wherein the first conductive contact is a drain electrode, the second conductive contact is a source electrode, and the third conductive contact is a gate electrode.

10. The semiconductor device of claim 7, wherein the third doping region has a greater dopant concentration than the second well region.

11. A method for fabricating a semiconductor device, comprising:
providing a semiconductor substrate having a first conductive type;
forming a plurality of separate doping regions having a second conductive type opposite to the first conductive type in the semiconductor substrate;
forming a semiconductor layer having the first conductive type on the semiconductor substrate;
forming a first well region and a second well region in a portion of the semiconductor layer, wherein the first well region and the second well region are separate and have the second conductive type;
forming a pair of third well regions in a portion of the semiconductor layer at opposite sides of the second well region, wherein the pair of third well regions have the first conductive type, and wherein the first well region and one of the third well regions are separated by the semiconductor layer;
performing a thermal annealing process to diffuse and connect the plurality of doping regions to form a deep well region having the second conductive type, wherein the deep well region is adjacent to the semiconductor layer between the first and second well region;
forming a plurality of isolation elements on the semiconductor layer, wherein the plurality of isolation elements are respectively between the third well regions and the first and second well region;
forming a first doping region having the second conductive type in the first well region; and
forming second doping regions having the first conductive type in the third well regions.

12. The method for fabricating a semiconductor device of claim 11, further comprising:
forming a first conductive contact on the semiconductor layer, wherein the first conductive contact is in physical contact with the first doping region;
forming a second conductive contact on the semiconductor layer, wherein the second conductive contact is simultaneously in physical contact with the second doping regions in the third well regions and with the second well region.

13. The method for fabricating a semiconductor device of claim 12, wherein the first conductive contact is a cathode electrode, and the second conductive contact is an anode electrode.

14. The method for fabricating a semiconductor device of claim 11, wherein the deep well region has a greater dopant concentration than the first well region and the second well region.

15. The method for fabricating a semiconductor device of claim 11, wherein the first doping region has a greater dopant concentration than the first well region.

16. The method for fabricating a semiconductor device of claim 11, wherein the second doping regions have a greater dopant concentration than the third well regions.

17. The method for fabricating a semiconductor device of claim 11, wherein the step of forming the first doping region in the first well region further comprises forming a third doping region in the second well region.

18. The method for fabricating a semiconductor device of claim 17, wherein the third doping region has a greater dopant concentration than the second well region.

19. The method for fabricating a semiconductor device of claim 17, further comprising:
forming a first conductive contact, a second conductive contact, and a third conductive contact, wherein the first conductive contact is on the semiconductor layer and in physical contact with the first doping region, the second conductive contact is on the semiconductor layer and simultaneously in physical contact with the second doping regions in the third well regions, and the third conductive contact is on the semiconductor layer and in physical contact with the third doping region.

20. The method for fabricating a semiconductor device of claim 19, wherein the first conductive contact is a drain electrode, the second conductive contact is a source electrode, and the third conductive contact is a gate electrode.

\* \* \* \* \*